US012724954B1

(12) United States Patent
Deng et al.

(10) Patent No.: US 12,724,954 B1
(45) Date of Patent: Sep. 1, 2026

(54) FIXING VOLTAGE DROP VIOLATION BASED ON TIMING AND CONGESTION

(71) Applicant: Cadence Design Systems, Inc., San Jose, CA (US)

(72) Inventors: Liqun Deng, Shanghai (CN); Yanli Zheng, Shanghai (CN); Fei Zhang, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 657 days.

(21) Appl. No.: 18/348,487

(22) Filed: Jul. 7, 2023

(51) Int. Cl.
*G06F 30/392* (2020.01)

(52) U.S. Cl.
CPC .................................. *G06F 30/392* (2020.01)

(58) Field of Classification Search
CPC ..................................................... G06F 30/392
See application file for complete search history.

(56) References Cited

U.S. PATENT DOCUMENTS 7,003,748 B1 * 2/2006 Hsu ....................... G06F 30/394 716/120
2003/0014201 A1 * 1/2003 Schultz ................. G06F 30/367 702/64
2005/0091629 A1 * 4/2005 Eisenstadt ............. G06F 30/327 326/81
2007/0094630 A1 * 4/2007 Bhooshan ............. G06F 30/394 716/120
2010/0190277 A1 * 7/2010 Lin ....................... G06F 30/398 716/120
2018/0144086 A1 * 5/2018 Chung .................... G06F 30/39
2025/0389767 A1 * 12/2025 Borkenhagen ..... G01R 31/2884

OTHER PUBLICATIONS

Huang et al., "Routability-driven Power/Ground Network Optimization", ACMTransactions on Design Automation of Electronic Systems, vol. 28, No. 4, Article 53, May Based on Machine Learning (Year: 2023).*

* cited by examiner

*Primary Examiner* — Jack Chiang
*Assistant Examiner* — Brandon Bowers
(74) *Attorney, Agent, or Firm* — Schwegman Lundberg & Woessner, P.A.

(57) ABSTRACT

Various embodiments provide for fixing voltage drops (e.g., IR drops) in a circuit design based on timing and congestion, which can be used as part of an electronic design automation (EDA) software.

20 Claims, 6 Drawing Sheets

FIXING VOLTAGE DROP VIOLATION BASED ON TIMING AND CONGESTION

TECHNICAL FIELD

Embodiments described herein relate to circuit design and, more particularly, to systems, methods, devices, and instructions for fixing voltage drops (e.g., IR drops) in a circuit design based on timing and congestion, where the fixing of voltage drops can be used as part of an electronic design automation (EDA) software.

BACKGROUND

Electronic design automation (EDA) software systems commonly generate a power and ground (PG) network (e.g., PG mesh) to distribute power and ground, from power and ground rails of a circuit design, to standard cells, macros, or both within the circuit design. The power and ground rails are usually disposed on the boundary or on a top layer of the circuit design (e.g., depending on packaging of the circuit design), and the PG network usually comprises conductive traces or planes that form the network. Typically, PG networks are created differently per technology process and custom design requirements of an EDA user (e.g., the metal stripe width and spacing of a PG network are different for different technology processes).

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
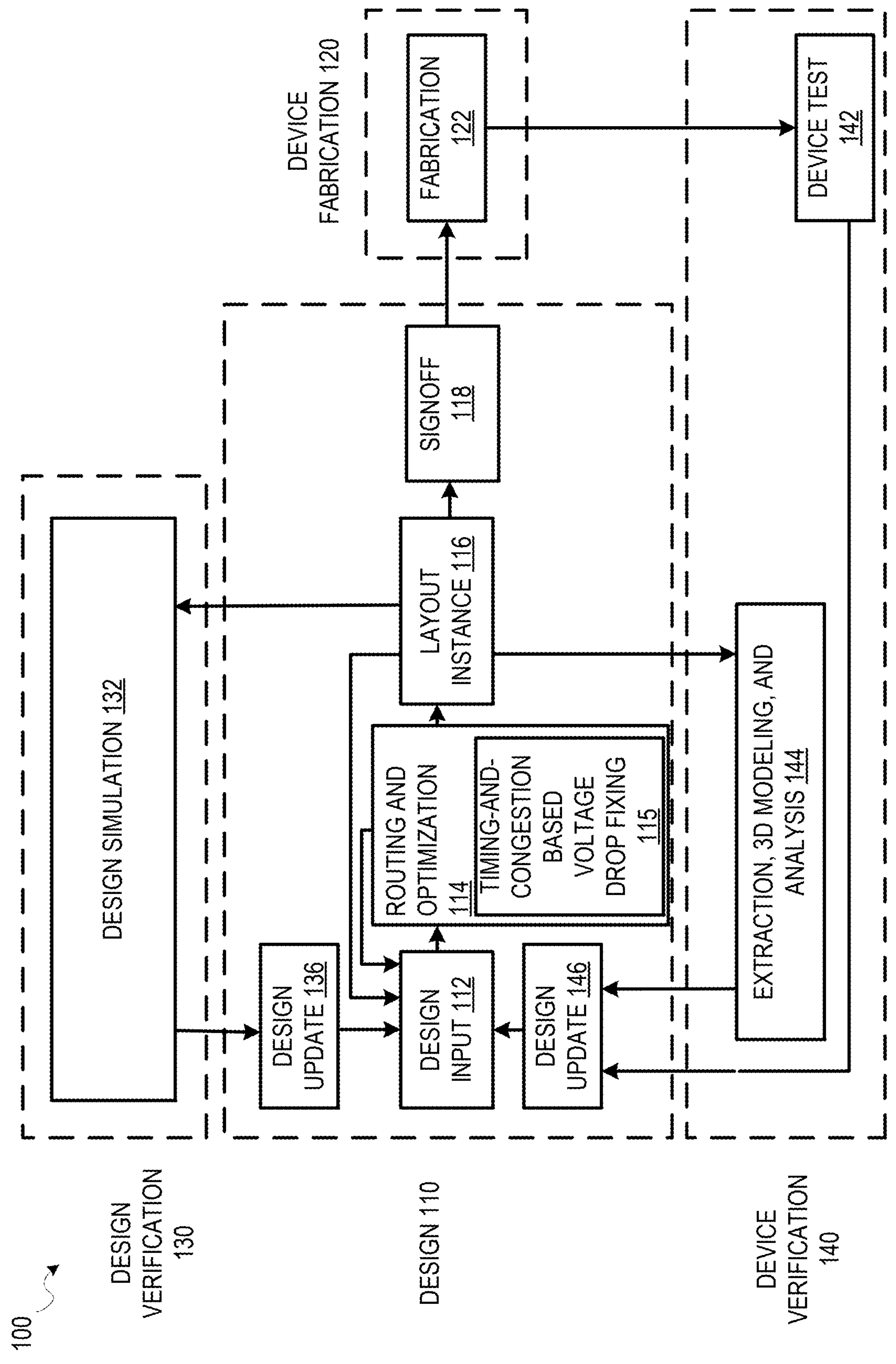
FIG. 1 is a diagram illustrating an example design process flow for fixing voltage drops in a circuit design based on timing and congestion, according to some embodiments.

In order for the circuit design to operate properly, a power network (e.g., power mesh) is usually created on the circuit design to work as power delivery network (PDN). If the power supply is not enough with the pre-draw PG mesh, voltage drop (also referred herein as IR drop) of one or more devices of the circuit designs can exceed the threshold voltage and these devices may not function properly. As such, in order to achieve a smaller IR drop, an EDA user usually adds a dense PG network to a circuit design. This is especially common for circuit designs relating to memories and macro intellectual property (IP), which need denser PG networks than standard cell areas of a circuit design.

While generating a much denser PG network can solve IR drop problems within a circuit design, a denser PG network can also lead to problems in the placement and routing of standard cells and hard macros. Routing resources of a circuit design are usually determined by the number of routing tracks of each metal layer of the circuit design, and the routing resources can be derived from one or more design rules of the particular process technology associated with the circuit design. Generally, the total routing resources of a circuit design are limited; if a circuit designer allocates too much routing tracks to a power network, there will be not enough of the routing tracks for signal nets of the circuit design, and this can cause routing congestion, design rule constraint (DRC) problems, or both.

Accordingly, circuit designers often create a PG network with just enough average density to get a balance between power/ground and signal routing, and then use a "patch" method to generate more PG stripes over IR drop hotspot areas, with the intention to fix IR drop issues locally. The patch methods include: (1) manually adding incremental PG stripes in the hotspot area; (2) adding PG wires in unoccupied routing tracks (also referred to as PG fill); (3) automatically adding a local PG network (e.g., PG mesh) in the hotspot area with a "predefined" pattern or local structure; and (4) automatically adding a local PG network in the hotspot area with a "flexible" pattern or local structure. Unfortunately, these and other methods can only fix IR drop violation heuristically. Additionally, such methods may either not be able to add the required PG stripes or, on the contrary, insert redundant PG stripes and make signal routing more difficult in congested areas. As a result, these methods could severely degrade timing after inserting new PG stripes.

Various embodiments described herein provide for fixing (e.g., addressing or repairing) voltage drops (e.g., IR drops) in a circuit design based on timing and congestion, where the fixing of voltage drops can be part of an EDA system, and can address various deficiencies of conventional methods for fixing voltage drops. In particular, some embodiments provide for fixing voltage drop violations (e.g., IR drop violations) with timing-and-congestion driven power and ground (PG) wire routing. In contrast to some traditional voltage drop fixing methods, such as adding extra PG stripes in a certain area, or using pre-defined PG patterns to patch a hotspot region, some embodiments described herein fix voltage drop violations by connecting a lower layer (e.g., metal 1 (M1) layer) PG rail in voltage drop hotspot regions to higher layer PG stripes using one or more wires (e.g., PG wires) routed by a signal router process (e.g., signal router) that is configured to route wires based on timing and congestion. According to some embodiments, one or more voltage drop hotspots (e.g., IR drop hotpots) are determined (e.g., identified) based on voltage drop analysis performed on a circuit design, such as a power rail analysis process. Various embodiments then use a signal router process to route (e.g., create) one or more wires (e.g., current paths) from one or more higher layer PG stripes down to one or more lower layer PG rails within the one or more voltage drop hotpots. The addition of these one or more wires can inject current (needed to fix the voltage drop) almost directly from power source to sinks, while still taking advantage of the signal router process's congestion and timing capabilities. Accordingly, an embodiment described herein can fix one or more voltage drop hotpots without degrading timing of the circuit design. Depending on the embodiment, methodologies described herein can operate on a post-route database associated with a circuit design (e.g., congested post-route database generated after signal nets have been routed) to fix one or more voltage drop hotpots. Additionally or alternatively, some embodiments fix one or more voltage drop hotpots while routing one or more signal networks of a circuit design by concurrently routing one or more voltage-drop-fixing wires (e.g., one or more PG wires) of the circuit design with the one or more signal networks. For example, an embodiment can balance between maintaining post-route DRC/timing and the effort of fixing voltage drops by specifying the weight of the voltage-drop-fixing wires and signal wires.

Unlike traditional methodologies for fixing voltage drops, an embodiment described herein does not use predefined PG patterns and can be used on circuit designs with routed signal nets, thereby enabling the embodiment to be fully automated and to be integrated into an existing physical circuit design flow, which can save turn-around time of design closure. Use of an embodiment described herein can fix each voltage drop hotspot with minimum overhead to existing place and route of a circuit design. Overall, benefits of various embodiments include, without limitation: voltage drop fixing based on voltage drop hotspots, timing, and congestion; the ability to be applied to either pre-route or post-route circuit designs; the ability to support concurrent signal routing and voltage-drop-fixing routing; DRC-free voltage drop fixing; flexible routing based on severity of voltage drop violation; and support of asymmetric power and ground connection points.

According to some embodiments, a circuit design is divided into a plurality of grid elements, the circuit design is analyzed for one or more voltage drops (e.g., in the power and ground network of the circuit design). One or more grid elements (e.g., tiles) having at least one voltage drop that is larger than a threshold are determined (e.g., identified) as voltage drop hotpots, and within each one or more voltage drop hotpot grid element (e.g., hotspot tile), one or more wires (e.g., one or more PG wires) are added to a power and ground (PG) network of the circuit design by routing the one or more wires between one or more lower layer PG rails and one or more higher layer PG stripes (of an existing PG network of the circuit design) using a signal router process. To route one or more wires within an individual voltage drop hotpot, an embodiment can assign one or more target connection points on one or more lower layer PG rails of the PG network within the individual drop hotspot, and the number of target connection points can depend on the degree (e.g., severity) of the voltage drop violation by the individual drop hotspot. Depending on the voltage drop, a target connection point can be a power network connection point or a ground network connection point. For instance, if the voltage drop violation is observed with respect to the ground network, the target connection point can be a ground network connection point and disposed on a ground rail within the individual voltage drop hotspot. The location of a target connection point can be determined by the signal router process (e.g., in a manner that avoids a DRC violation). Additionally, to route one or more wires within an individual voltage drop hotpot, an embodiment can assign a source connection point (e.g., within the voltage drop grid element) on a higher layer PG stripe of the PG network. The location of the source connection point can be determined by the signal router process (e.g., in a manner that avoids a DRC violation). For some embodiments, a user can specify one layer or a layer range of the PG stripes as the source connection points.

According to various embodiments, a signal router process, which is used for routing a signal network of a circuit design, is used to route one or more wires (e.g., one or more PG wires) that connect source connection points and target connection points. As described herein, each wire connection can provide a current path from the higher layer PG stripe (of an existing PG network of the circuit design), which is close to a voltage source of the circuit design, to a lower layer PG rail of a voltage drop hotspot grid element. The fanout of a source connection point can be flexibly adjusted by the signal router process such that one source connection point can be connected to and drive one or multiple target connection points. This fanout flexibility can be beneficial when routing congestion is high and routing resources are limited post-route of signal networks of a circuit design.

Depending on the embodiment, one or more of wire width, wire spacing, and via size of a connection point can be pre-defined (e.g., defined by a user) or can be flexibly adjusted by the signal router process. In this way, different sizes of voltage-drop-fixing wires can be applied to hotspot grid elements of different voltage drop violations, and when a hotspot grid element has a particularly large voltage drop violation, a wider voltage-drop-fixing wire connection can be used. Different wire and via sizes on different layers of a circuit design can optimize resistance of a power and ground connection when crossing each layer. Depending on the embodiment, the number of power and ground connection points can be different. For instance, if a voltage drop hotspot grid element has worse ground voltage drop than power, more ground target connection points can be assigned to the voltage drop hotspot grid element. Additionally or alternatively, bigger wire width of the ground connection can be used.

When a circuit design is divided into grid elements, an embodiment can control the size of grid elements such that voltage drop violations can be averagely fixed by a reasonable number of target connection points. For instance, an embodiment can use a typical grid element size of four standard row heights for grid elements. For some embodiments, the grid element size is adjusted according to a value of voltage drop threshold and the voltage drop observed.

Various embodiments can be used in different ways. For example, voltage-drop-fixing PG connections can be routed (by a signal router process) on a circuit design after signal networks have been routed (e.g., applying voltage drop fixing PG connections on a signal routed circuit design database), and can be applied without modifying any existing PG stripes or signal network routes. Alternatively, voltage-drop-fixing PG connections can be routed by a signal router process while the signal router process dynamically decides whether to modify existing signal routes or to detour the newly added voltage-drop-fixing PG connections based on timing and congestion consideration. Depending on different routing strategies, when there is a DRC rule violation from adding one or more voltage-drop-fixing PG connections, a user can choose to remove the newly added one or more PG connection, or can keep them and run an engineering change order (ECO) route on any impacted signal routing.

In another example, voltage-drop-fixing PG connections can be routed (by a signal router process) concurrently with signal nets of a circuit design. The priority of the PG network and signal network routes can be adjusted by the signal router process dynamically based on timing, power, congestion, or one or more other factors. For instance, the signal router process can keep a timing-critical signal network untouched but detour a non-timing-critical signal network in a congested area to provide a routing path for voltage-drop-fixing wires (which can fix a voltage drop violation without degrading existing timing).

As used herein, a power and ground (PG) network (or net) of a circuit design can supply power for both standard cells and macros of the circuit design. The PG network can comprise a power and ground mesh, which is arranged in a mesh-like structure or arrangement. A stripe (or PG stripe) can refer to a stripe of an existing power and ground (PG) network (e.g., PG mesh) of a circuit design, which can be routed (e.g., created) in the circuit design by a power and ground (PG) router process. For various embodiments, a PG network (e.g., initial PG network) of a circuit design is routed prior to the addition of one or more voltage-drop-fix wires by an embodiment described herein. A power and ground (PG) rail of a circuit design can comprise a power rail or a ground rail of the circuit design.

As used herein, a power rail analysis process (or rail analysis process) can comprise a process that analyzes a voltage distribution and potential voltage drops in a circuit design (e.g., in a PG network thereof). A power rail analysis process can analyze a circuit design by simulating the circuit design under different operating conditions and calculating voltage drops across different portions of the circuit design. A power rail analysis process can determine (e.g., identify) one or more voltage drops in a circuit design, and report such drops separately for the power network of the circuit design and the ground network of the circuit design. A voltage drop (e.g., IR drop) can refer to drop in voltage due to the resistance of the conductors and components in the circuit design (e.g., in the PG network thereof). Generally, a voltage drop can cause problems in a circuit design, such as reduced performance, reliability issues, or component failure. Various embodiments described herein can determine (e.g., identify) identify areas of a circuit design where voltage drops are excessive and fix those areas (with additional PG connections) to reduce the voltage drop.

As used herein, a tile can refer to an element of a grid that overlays a circuit design (e.g., a two-dimensional layout representing the circuit design), where the element can have a quadrilateral shape (e.g., square or rectangle) and the element represents a portion of the circuit design. A hotspot tile can represent a tile representing a portion of a circuit design that includes a voltage drop that surpasses a voltage drop threshold (e.g., a voltage drop violation).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for fixing voltage drops in a circuit design based on timing and congestion, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist, as placed by the layout instance 116, describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance. A design update 136 based on the design verification phase 130, a design update 146 from the device test 142 operations or the extraction, 3D modeling, and analysis 144 operations, or the design input 112 operation may occur after the initial layout instance 116 is generated. In various embodiments, whenever design inputs are used to update or change an aspect of a circuit design, a timing analysis and the routing and optimization 114 operation may be performed.

As shown, the routing and optimization 114 operations include timing-and-congestion based voltage drop fixing 115 operations, which may be performed in accordance with various embodiments described herein. For some embodiments, the timing-and-congestion based voltage drop fixing 115 operations is performed after a power and ground (PG) network is created for a circuit design and after a signal network is routed for the circuit design. For some embodiments, the timing-and-congestion based voltage drop fixing 115 operations is performed after a PG network is created for a circuit design and perform concurrently with the routing of a signal network of the circuit design.

Figure 2:
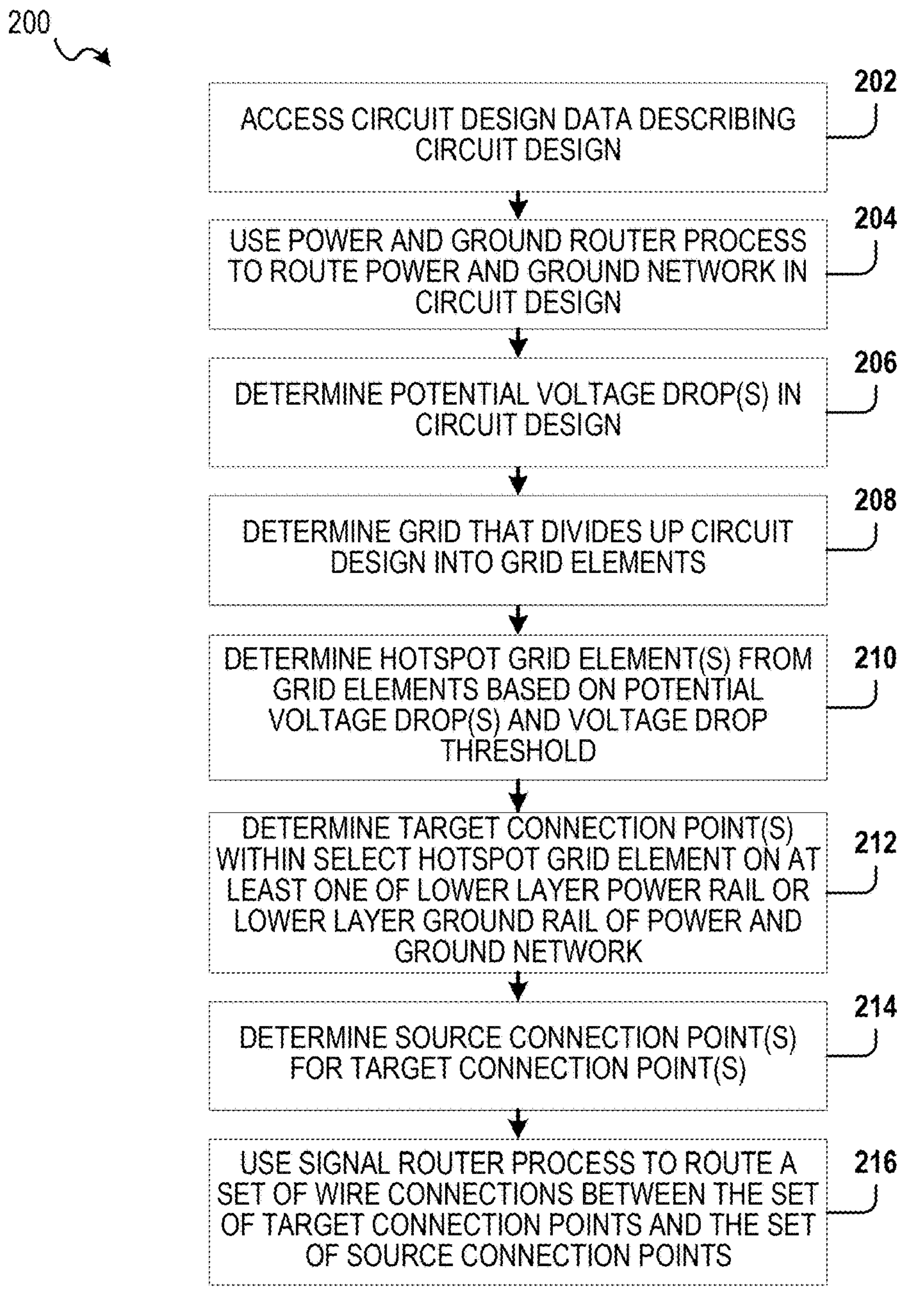
FIG. 2 is a flowchart illustrating an example method for fixing voltage drops in a circuit design based on timing and congestion, according to some embodiments.

FIG. 2 is a flowchart illustrating an example method 200 for fixing voltage drops in a circuit design based on timing and congestion, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. An operation of the method 200 (or another method described herein) may be performed by a hardware processor (e.g., central processing unit or graphics processing unit) of a computing device (e.g., desktop, server, etc.).

As illustrated, at operation 202, circuit design data that describes a circuit design is accessed. During operation 204, a power and ground router process is used to route a power and ground network in the circuit design. For operation 206, a set of potential voltage drops in the circuit design (e.g., voltage drops of the PG network of the circuit design) is determined. For some embodiments, operation 206 comprises using a power rail analysis to analyze the circuit design (e.g., analyze the PG network of the circuit design) to determine the set of potential voltage drops. For instance, the power rail analysis can generate a voltage drop analysis report (e.g., an IR drop analysis report) and, in some instances, can generate a first voltage drop analysis report for voltage drops with respect to a ground network of the PG network and a second voltage drop analysis report for voltage drops with respect to a power network of the PG network. For some embodiments, a first set of voltage drop hotspots is identified using the first voltage drop analysis report and a second set of voltage drop hotspots is identified using the second voltage drop analysis report. Accordingly, with respect to the PG network of the circuit design, the set of potential voltage drops in the circuit design can comprise one or more potential voltage drops with respect to a ground network (e.g., ground rail) of the PG network, and one or more potential voltage drops with respect to a power network (e.g., power rail) of the PG network.

At operation 208, a grid is determined for the circuit design where the grid divides up the circuit design into a plurality of grid elements (e.g., plurality of tiles). The grid can comprise an overlay disposed over (e.g., the two-dimensional layout representing) the circuit design, and each grid element (e.g., tile) can represent a portion of the circuit design (e.g., a portion of a two-dimensional layout of the circuit design), where the portion can comprise one or more circuit elements that result in a voltage drop within the circuit design. A size of individual grid elements (e.g., tiles) of the plurality of grid elements can be defined by a user, or can be dynamically adjusted by a process (e.g., signal routing process). Generally, the size of the individual grid elements can be adjusted to make voltage drop violations (e.g., voltage drops that renders an individual grid element to be a hotspot) to be averagely fixed by a reasonable number of target connection points to be added to individual grid elements. Accordingly, a size of individual grid elements can be adjusted based on a value of a voltage drop threshold. A typical grid element size can comprise, for example, four standard row heights.

For operation 210, a set of hotspot grid elements is determined from the plurality of grid elements (determined by operation 208) based on the set of potential voltage drops (determined by operation 206) and a voltage drop threshold. For instance, if an individual grid element comprises a potential voltage drop that surpasses the voltage drop threshold, the individual grid element can be marked or regarded as a hotspot grid element. The value of the voltage drop threshold can comprise a percentage value (e.g., 5% drop from a power source of the circuit design), and a value of an individual potential voltage drop surpasses the voltage drop threshold based on what percentage drop from a power source (of the circuit design) the individual potential voltage drop represents. For various embodiments, the voltage drop threshold is defined by a user.

For a select hotspot grid element in the set of hotspot grid elements (determined by operation 210), at operation 212, a set of target connection points is determined (e.g., identified and added to the circuit design) within the select hotspot grid element, where the target connection points are disposed on at least one of a lower layer power rail or a lower layer ground rail of the power and ground network. For instance, the lower layer can comprise an M1 layer of the circuit design. According to various embodiments, a location of an individual target connection point (e.g., on a lower layer ground rail or a lower layer power rail) is determined by a signal router process. For example, an exact location of each target connection point can be decided by the signal router to avoid DRC violation.

A number of connections in the set of target connections can be determined based on a potential voltage drop of the select hotspot grid element (as determined by operation 206), the voltage drop threshold (e.g., as defined by a user), and a drop severity mapping table, where the drop severity mapping table can map a severity of the potential voltage drop to a number of connection points to include. For instance, the drop severity mapping table can specify if the potential voltage drop represents a percentage drop from a power source of the circuit design that surpasses a certain threshold value (e.g., 1% threshold); then a certain number of target connections points determined (e.g., added) within the select hotspot grid element. For some embodiments, different threshold values (or different ranges of threshold values) can be mapped to different numbers of connection points (e.g., 1% threshold value maps to two target connection points; 2% threshold value maps to four target connection points; 3% threshold value maps to eight target connection points). Depending on the embodiment, the drop severity mapping table can be pre-defined (e.g., by a user).

For some embodiments, the set of target connection points comprises at least one of a power net connection point or a ground net connection point. For instance, the set of target connection points can include one or more power net connection points, one or more ground net connection points, or both based on the set of potential voltage drops (e.g., voltage drop analysis results for ground network of the circuit design and voltage drop analysis results for power network of the circuit design). Specifically, one or more power net connection points can be added to the set of target connection points to address voltage drop violations on a power network of the PG network (of the circuit design), and one or more ground net connection points can be added to the set of target connection points to address voltage drop violations on a ground network of the PG network (of the circuit design). Accordingly, the number of ground net connection points and power net connection points can be added to the select hotspot grid element.

During operation 214, a set of source connection points is determined (e.g., identified and added to the circuit design) for the set of target connection points (determined for the select hotspot grid element by operation 212), where an individual source connection point of the set of source connection points is disposed on a higher layer stripe of the power and ground network. For example, a location of each source connection point can be decided by the signal router to avoid DRC violation. The higher layer can comprise a top metal layer of the circuit design. For some embodiments, a user specifies at least one of a layer or a range of layers for the higher layer. Additionally, an individual source connection point may or may not be within the select hotspot grid element. For various embodiments, the number of connection points in the set of source connection points can be different from the number of connection points in the set of target connection points. Additionally, for some embodiments, the signal router process is configured to adjust a fanout of an individual source connection point of the set of source connection points such that the individual source connection point drives (e.g., connects to) multiple target connection points of the set of target connection points. This can be useful when routing congestion is high and routing resources are limited in the circuit design.

At operation 216, a signal router process is used to route (e.g., add and route) a set of wire connections (e.g., power-grid (PG) wire connections) in the circuit design between the set of target connection points (determined by operation 212) and the set of source connection points (determined by operation 214). For various embodiments, the set of wire connections (e.g., PG wire connections) is routed without modifying any existing stripes or existing signal network routes of the circuit design. For some embodiments, the signal router process is used to route one or more signal networks of the circuit design prior to the routing of the set of wire connections at operation 216. Alternatively, for some embodiments, the signal router process is used to route one or more signal networks of the circuit design concurrently with the routing of the set of wire connections. As described herein, the priority of the PG network and signal network routes can be adjusted by the signal router process dynamically based on timing, power, congestion, or one or more other factors. For instance, the signal router process can keep timing-critical signal network untouched but detour a non-timing-critical signal network in a congested area to provide a routing path for voltage-drop-fixing wires. For some embodiments, the weight of voltage-drop-fixing wires and signal wires can be specified to adjust priority.

Figure 3:
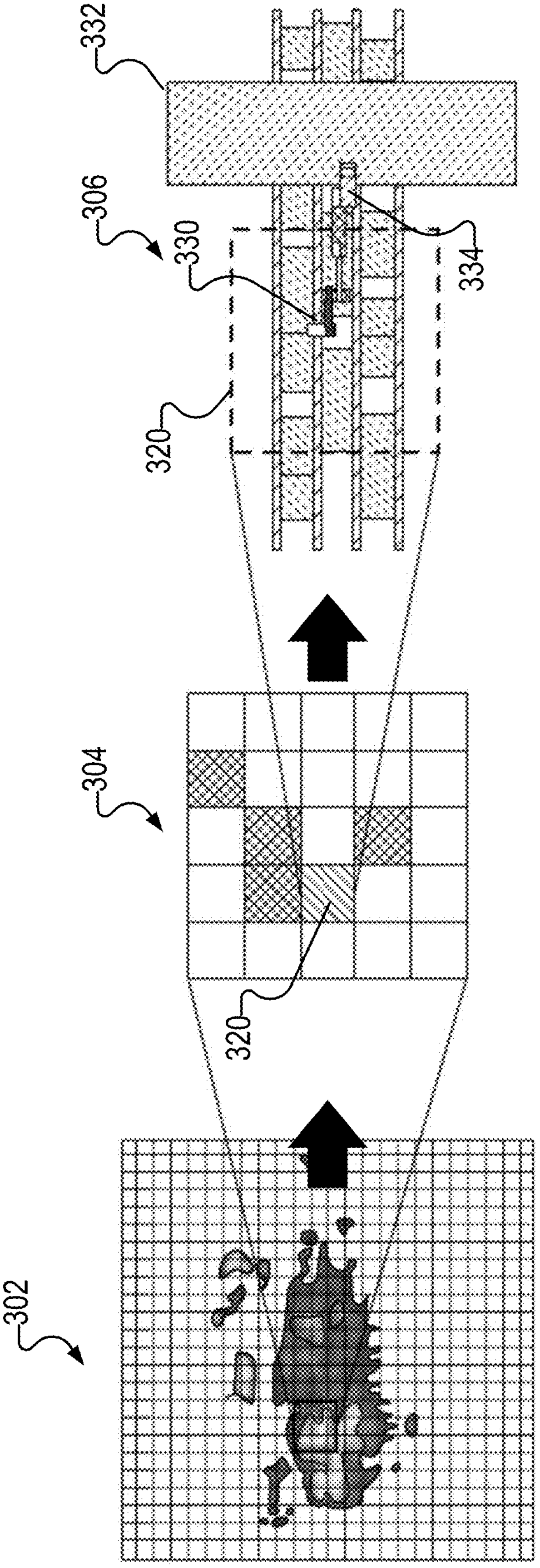
FIG. 3 is a diagram illustrating an example of determining a hotspot grid element of a circuit design, according to some embodiments.

FIG. 3 is a diagram illustrating an example of determining a hotspot grid element of a circuit design, according to some embodiments. In particular, various embodiments determine grid elements for a circuit design and determine potential voltage drops of the circuit (e.g., by a power rail analysis process), which are illustrated at 302 as the grid and the heat map over the circuit design respectively. Out of the determined grid elements, various embodiments determine at least one voltage drop hotspot grid element (320), as shown at 304. For the at least one voltage drop hotspot grid element (320), various embodiments determine one or more target connection points disposed on a lower layer PG rail (330) within the at least one voltage drop hotspot, determine one or more source connection points disposed on a higher layer PG stripe (332), and route at least one voltage-drop-fixing wire (334) between the one or more target connection points and the one or more source connection points, as shown at 306. As described herein, the at least one PG wire can fix a voltage drop violation of the at least one voltage drop hotspot grid element (320).

Figure 4:
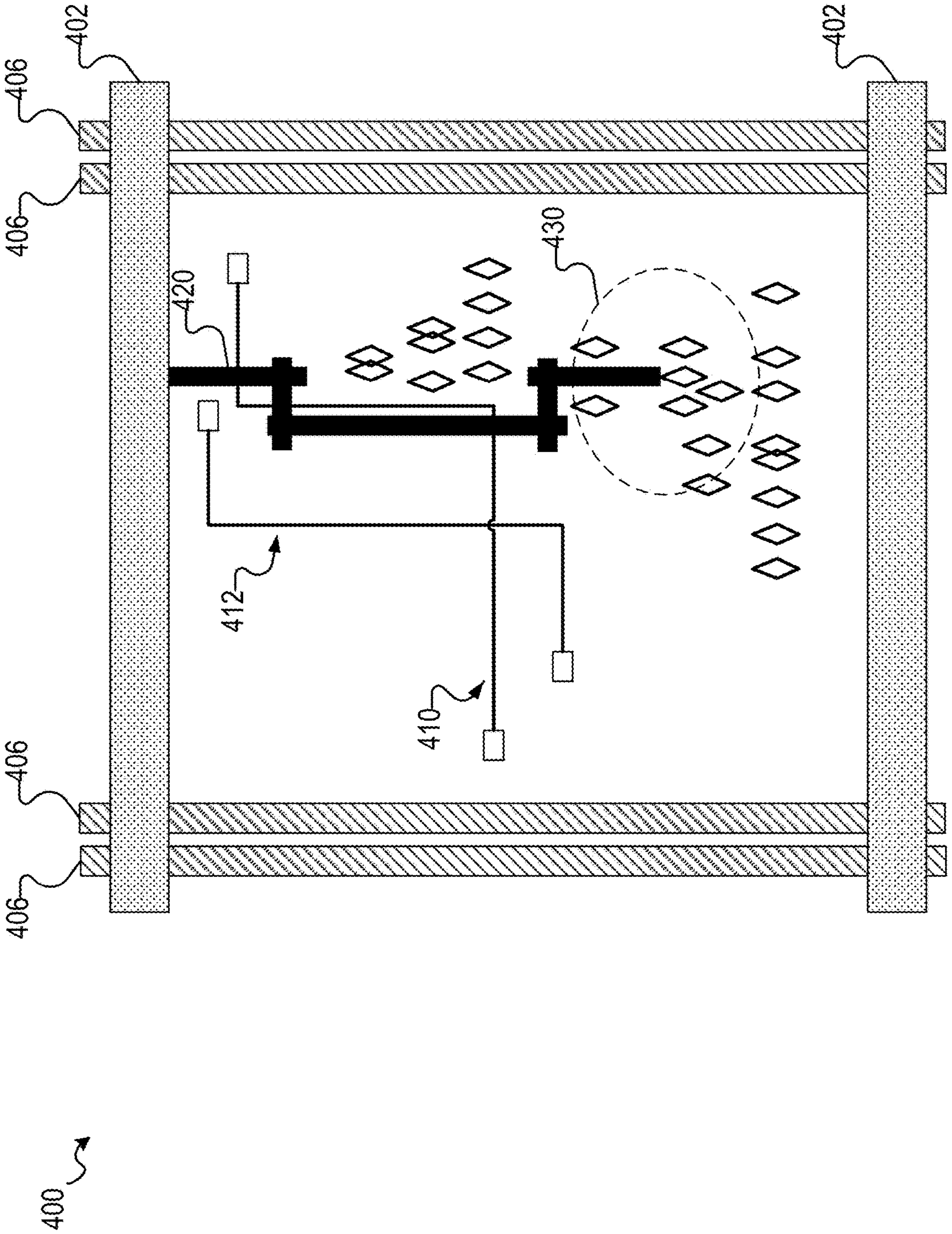
FIG. 4 is a diagram illustrating an example of routing a wire from a source connection point to a target connection point within a portion of a circuit design, according to some embodiments.

FIG. 4 is a diagram illustrating an example of routing a wire from a source connection point to a target connection point within a portion 400 of a circuit design, according to some embodiments. In particular, FIG. 4 illustrates how according to some embodiments, a signal route process can keep timing-critical signal network untouched, while detouring a non-timing-critical signal network in a congested area to provide a routing path for a voltage-drop-fixing wire, which can fix a voltage drop violation within a voltage drop hotspot grid element without degrading existing timing of a circuit design. As shown, the portion 400 (of the circuit design) comprises higher layer PG stripes 402 (of a PG network), lower layer PG stripes 406, a critical signal network 410 that is not detoured by the signal router process, and a non-critical signal network 412 that is detoured by the signal router process. As also shown, the non-critical signal network 412 is detoured to make a path for a PG wire 420, added to the circuit design, from a source connection point on the higher layer PG stripe 402 to a target connection point (on a lower layer PG rail) within a voltage drop hotspot 430.

Figure 5:
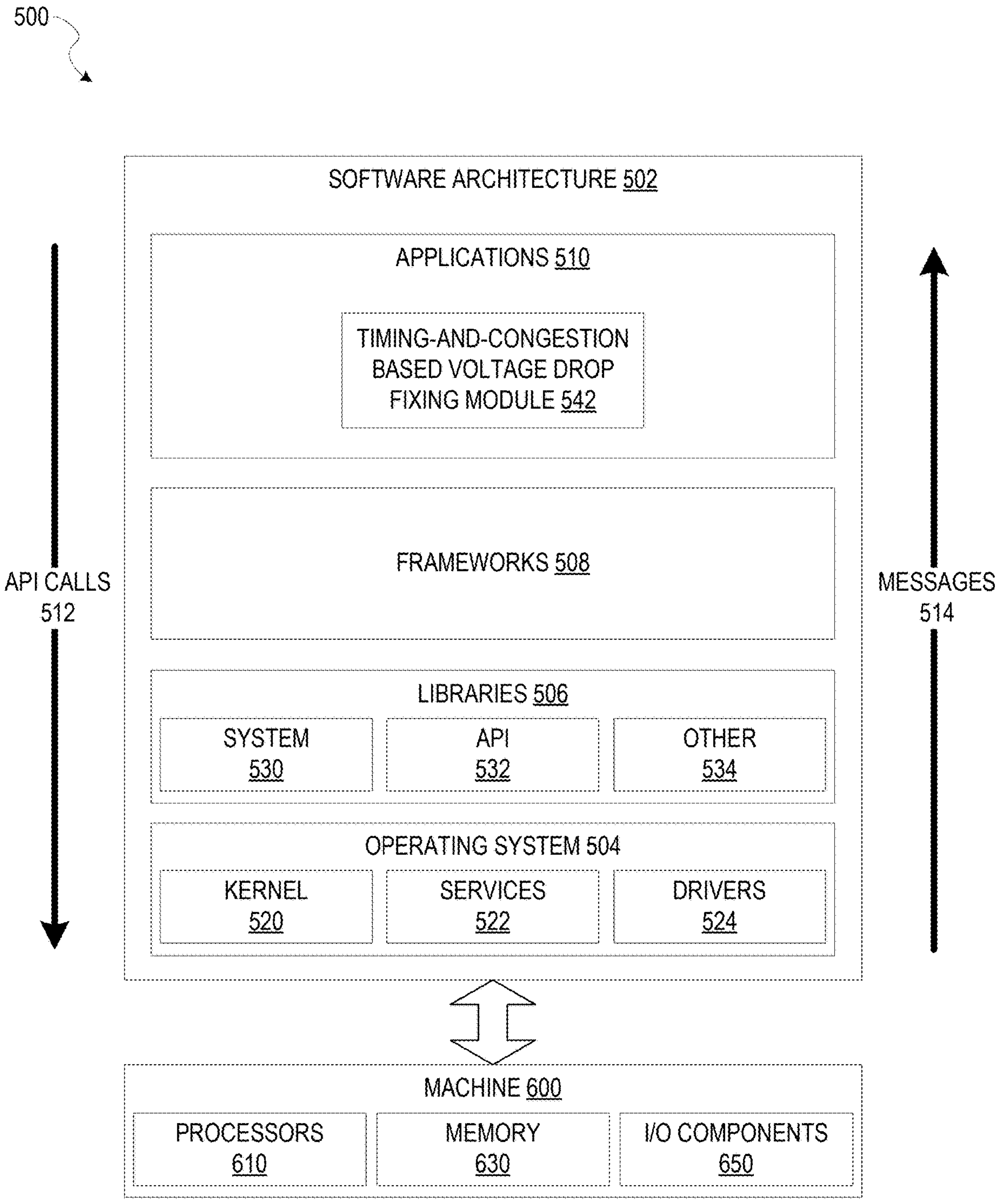
FIG. 5 is a block diagram illustrating an example of a software architecture that may be operating on an EDA computing device and may be used with methods for fixing voltage drops in a circuit design based on timing and congestion, according to some embodiments.

FIG. 5 is a block diagram 500 illustrating an example of a software architecture 502 that may be operating on an EDA computer and may be used with methods for fixing voltage drops in a circuit design based on timing and congestion, according to some embodiments. The software architecture 502 can be used as an EDA computing device to implement any of the methods described above. Aspects of the software architecture 502 may, in various embodiments, be used to store circuit designs, and to facilitate generation of a circuit design in an EDA environment by fixing voltage drops in a circuit design based on timing and congestion.

FIG. 5 is merely a non-limiting example of a software architecture 502, and it will be appreciated that many other architectures can be implemented to facilitate the functionality described herein. In various embodiments, the software architecture 502 is implemented by hardware such as a machine 600 of FIG. 6 that includes processors 610 (e.g., hardware processors), memory 630, and input/output (I/O) components 650. In this example, the software architecture 502 can be conceptualized as a stack of layers where each layer may provide a particular functionality. For example, the software architecture 502 includes layers such as an operating system 504, libraries 506, software frameworks 508, and applications 510. Operationally, the applications 510 invoke application programming interface (API) calls 512 through the software stack and receive messages 514 in response to the API calls 512, consistent with some embodiments. In various embodiments, any client device, any server computer of a server system, or any other device described herein may operate using elements of the software architecture 502. An EDA computing device described herein may additionally be implemented using aspects of the software architecture 502, with the software architecture 502 adapted for fixing voltage drops in a circuit design based on timing and congestion in any manner described herein.

In some embodiments, an EDA application of the applications 510 fixes voltage drops in a circuit design based on timing and congestion according to embodiments described herein using various modules within the software architecture 502. For example, in some embodiments, an EDA computing device similar to the machine 600 includes the memory 630 and the one or more processors 610. The processors 610 also implement timing-and-congestion based voltage drop fixing module 542 for fixing voltage drops in a circuit design based on timing and congestion, in accordance with various embodiments described herein.

In various other embodiments, rather than being implemented as modules of the one or more applications 510, the timing-and-congestion based voltage drop fixing module 542 may be implemented using elements of the libraries 506, the operating system 504, or the software frameworks 508.

In various implementations, the operating system 504 manages hardware resources and provides common services. The operating system 504 includes, for example, a kernel 520, services 522, and drivers 524. The kernel 520 acts as an abstraction layer between the hardware and the other software layers, consistent with some embodiments. For example, the kernel 520 provides memory management, processor management (e.g., scheduling), component management, networking, and security settings, among other functionalities. The services 522 can provide other common services for the other software layers. The drivers 524 are responsible for controlling or interfacing with the underlying hardware, according to some embodiments. For instance, the drivers 524 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 506 provide a low-level common infrastructure utilized by the applications 510. The libraries 506 can include system libraries 530 such as libraries of blocks for use in an EDA environment or other libraries that can provide functions such as memory allocation functions, string manipulation functions, mathematic functions, and the like. In addition, the libraries 506 can include API libraries 532 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 506 may also include other libraries 534.

The software frameworks 508 provide a high-level common infrastructure that can be utilized by the applications 510, according to some embodiments. For example, the software frameworks 508 provide various graphic user interface (GUI) functions, high-level resource management, high-level location services, and so forth. The software frameworks 508 can provide a broad spectrum of other APIs that can be utilized by the applications 510, some of which may be specific to a particular operating system 504 or platform. In various embodiments, the systems, methods, devices, and instructions described herein may use various files, macros, libraries, and other elements of an EDA design environment to implement fixing voltage drops in a circuit design based on timing and congestion as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 502, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 600 including processors 610), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 600, but deployed across a number of machines 600. In some embodiments, the processors 610 or processor-implemented modules are located in a single geographic location (e.g., within a home environment, an office environment, or a server farm). In some other embodiments, the processors or processor-implemented modules are distributed across a number of geographic locations.

Figure 6:
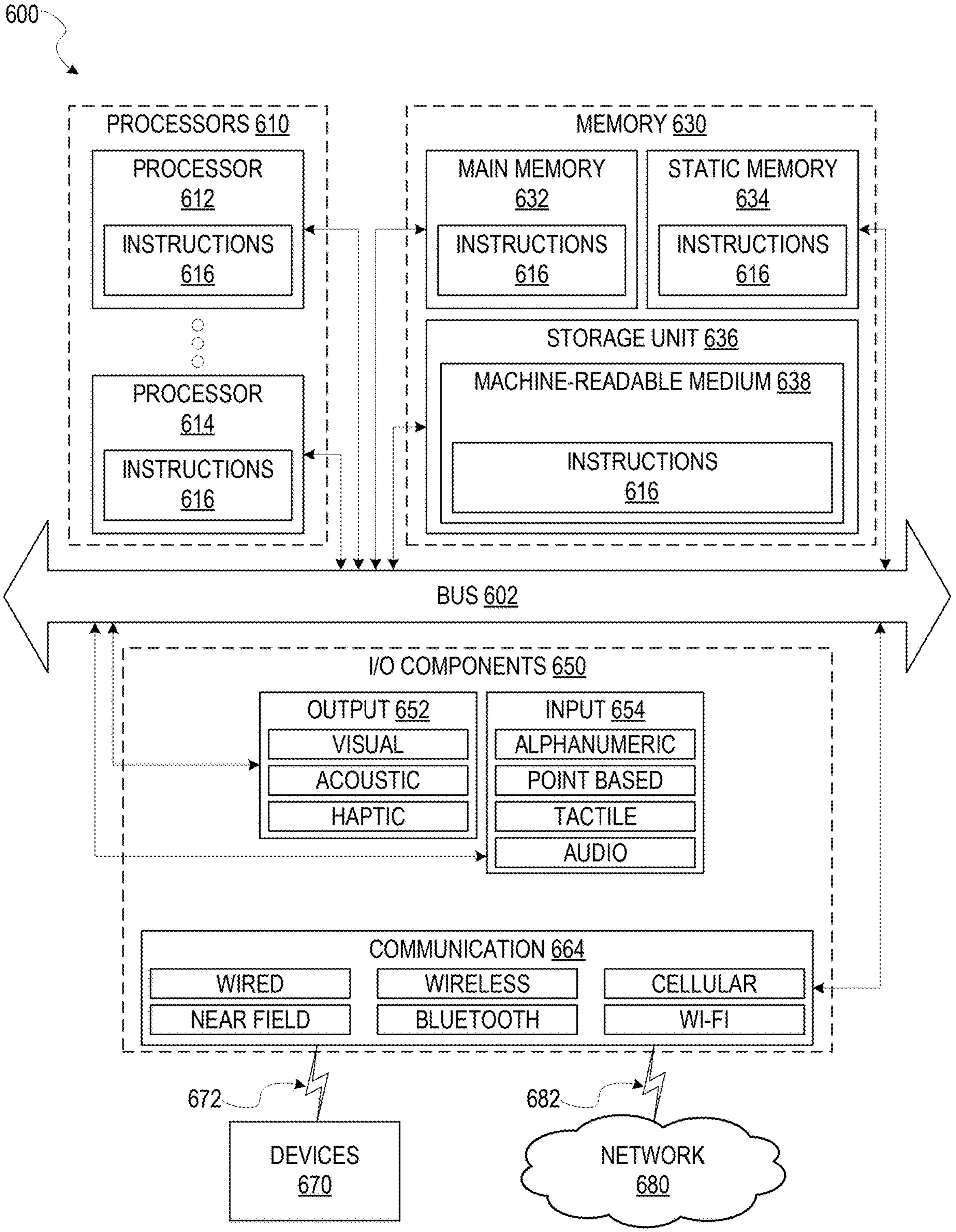
FIG. 6 is a diagram representing a machine in the form of a computer system within which a set of instructions are executed, causing the machine to perform any one or more of the methods discussed herein, according to some embodiments.

FIG. 6 is a diagrammatic representation of the machine 600 in the form of a computer system within which a set of instructions may be executed for causing the machine 600 to perform any one or more of the methodologies discussed herein, according to some embodiments. FIG. 6 shows components of the machine 600, which is, according to some embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein can be executed. In alternative embodiments, the machine 600 operates as a standalone device or can be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 can comprise, but not be limited to, a server computer, a client computer, a personal computer (PC), a tablet computer, a laptop computer, a netbook, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

In various embodiments, the machine 600 comprises processors 610, memory 630, and I/O components 650, which can be configured to communicate with each other via a bus 602. In some embodiments, the processors 610 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 612 and a processor 614 that may execute the instructions 616. The term "processor" is intended to include multi-core processors 610 that may comprise two or more independent processors 612, 614 (also referred to as "cores") that can execute the instructions 616 contemporaneously. Although FIG. 6 shows multiple processors 610, the machine 600 may include a single processor 612 with a single core, a single processor 612 with multiple cores (e.g., a multi-core processor 612), multiple processors 610 with a single core, multiple processors 610 with multiple cores, or any combination thereof.

The memory 630 comprises a main memory 632, a static memory 634, and a storage unit 636 accessible to the processors 610 via the bus 602, according to some embodiments. The storage unit 636 can include a machine-readable medium 638 on which are stored the instructions 616 embodying any one or more of the methodologies or functions described herein. The instructions 616 can also reside, completely or at least partially, within the main memory 632, within the static memory 634, within at least one of the processors 610 (e.g., within the processor's cache memory), or any suitable combination thereof, during execution thereof by the machine 600. Accordingly, in various embodiments, the main memory 632, the static memory 634, and the processors 610 are considered machine-readable media 638.

As used herein, the term "memory" refers to a machine-readable medium 638 able to store data temporarily or permanently and may be taken to include, but not be limited to, random-access memory (RAM), read-only memory (ROM), buffer memory, flash memory, and cache memory. While the machine-readable medium 638 is shown, in some embodiments, to be a single medium, the term "machine-readable medium" should be taken to include a single medium or multiple media (e.g., a centralized or distributed database, or associated caches and servers) able to store the instructions 616. The term "machine-readable medium" shall also be taken to include any medium, or combination of multiple media, that is capable of storing instructions (e.g., the instructions 616) for execution by a machine (e.g., the machine 600), such that the instructions, when executed by one or more processors of the machine (e.g., the processors 610), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term “machine-readable medium” specifically excludes non-statutory signals per se.

The I/O components 650 include a wide variety of components to receive input, provide output, produce output, transmit information, exchange information, capture measurements, and so on. In general, it will be appreciated that the I/O components 650 can include many other components that are not shown in FIG. 6. The I/O components 650 are grouped according to functionality merely for simplifying the following discussion, and the grouping is in no way limiting. In various embodiments, the I/O components 650 include output components 652 and input components 654. The output components 652 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 654 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, “constraints,” “requirements,” “design elements,” and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 650 may include communication components 664 operable to couple the machine 600 to a network 680 or devices 670 via a coupling 682 and a coupling 672, respectively. For example, the communication components 664 include a network interface component or another suitable device to interface with the network 680. In further examples, the communication components 664 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 670 may be another machine or any of a wide variety of peripheral devices (e.g., a peripheral device coupled via a USB).

In various embodiments, one or more portions of the network 680 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling.

Furthermore, the machine-readable medium 638 is non-transitory (in other words, not having any transitory signals) in that it does not embody a propagating signal. However, labeling the machine-readable medium 638 “non-transitory” should not be construed to mean that the machine-readable medium 638 is incapable of movement; the machine-readable medium 638 should be considered as being transportable from one physical location to another. Additionally, since the machine-readable medium 638 is tangible, the machine-readable medium 638 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term “or” may be construed in either an inclusive or exclusive sense. The terms “a” or “an” should be read as meaning “at least one,” “one or more,” or the like. The use of words and phrases such as “one or more,” “at least,” “but not limited to,” or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system comprising:

a memory storing instructions; and a hardware processor communicatively coupled to the memory and configured by the instructions to perform operations comprising:

accessing circuit design data that describes a circuit design, the circuit design comprising a power and ground network;

determining a set of potential voltage drops in the circuit design;

determining a grid that divides up the circuit design into a plurality of grid elements;

determining a set of hotspot grid elements from the plurality of grid elements based on the set of potential voltage drops and a voltage drop threshold; and for a select hotspot grid element in the set of hotspot grid elements:

determining a set of target connection points within the select hotspot grid element on at least one of a lower layer power rail or a lower layer ground rail of the power and ground network;

determining a set of source connection points for the set of target connection points, an individual source connection point of the set of source connection points being disposed on a higher layer stripe of the power and ground network; and using a signal router process to route a set of power-grid wire connections in the circuit design between the set of target connection points and the set of source connection points.

2. The system of claim 1, wherein a number of connections in the set of target connection points is determined based on a potential voltage drop of the select hotspot grid element, the voltage drop threshold, and a drop severity mapping table.

3. The system of claim 1, wherein the determining of the set of potential voltage drops in the circuit design comprises performing a power rail analysis process on the circuit design.

4. The system of claim 1, wherein the power and ground network of the circuit design are generated by a power and ground router process.

5. The system of claim 1, wherein the determining of the set of target connection points within the select hotspot grid element comprises using the signal router process to determine a set of locations for the set of target connection points.

6. The system of claim 1, wherein a size of individual grid elements of the plurality of grid elements is at least one of defined by a user or dynamically adjusted by a process.

7. The system of claim 1, wherein the voltage drop threshold comprises a value representing a percentage drop from a power source of the circuit design.

8. The system of claim 1, wherein the voltage drop threshold is defined by a user.

9. The system of claim 1, wherein the signal router process is used to route a signal network of the circuit design concurrently with the routing of the set of power-grid wire connections.

10. The system of claim 1, wherein the signal router process is used to route a signal network of the circuit design prior to the routing of the set of power-grid wire connections.

11. The system of claim 1, wherein the set of power-grid wire connections is routed without modifying any existing stripes or existing signal network routes.

12. The system of claim 1, wherein the set of target connection points comprises at least one of a power net connection point or a ground net connection point.

13. The system of claim 1, wherein the signal router process is configured to adjust a fanout of an individual source connection point of the set of source connection points such that the individual source connection point drives multiple target connection points of the set of target connection points.

14. The system of claim 1, wherein a user specifies at least one of a layer or a range of layers for the higher layer stripe.

15. A non-transitory computer-readable medium comprising instructions that, when executed by a hardware processor of a device, cause the device to perform operations comprising:

accessing circuit design data that describes a circuit design;

using a power and ground router process to route a power and ground network in the circuit design;

determining a set of potential voltage drops in the circuit design;

determining a grid that divides up the circuit design into a plurality of grid elements;

determining a set of hotspot grid elements from the plurality of grid elements based on the set of potential voltage drops and a voltage drop threshold; and for a select hotspot grid element in the set of hotspot grid elements:

determining a set of target connection points within the select hotspot grid element on at least one of a lower layer power rail or a lower layer ground rail of the power and ground network;

determining a set of source connection points for the set of target connection points, an individual source connection point of the set of source connection points being disposed on a higher layer stripe of the power and ground network; and using a signal router process to route a set of power grid wire connections between the set of target connection points and the set of source connection points.

16. The non-transitory computer-readable medium of claim 15, wherein a number of connections in the set of target connection points is determined based on a potential voltage drop of the select hotspot grid element, the voltage drop threshold, and a drop severity mapping table.

17. The non-transitory computer-readable medium of claim 15, wherein the determining of the set of potential voltage drops in the circuit design comprises performing a power rail analysis process on the circuit design.

18. The non-transitory computer-readable medium of claim 15, wherein the power and ground network of the circuit design are generated by a power and ground router process.

19. The non-transitory computer-readable medium of claim 15, wherein the determining of the set of target connection points within the select hotspot grid element comprises using the signal router process to determine a set of locations for the set of target connection points.

20. A method comprising:

determining a set of potential voltage drops in a circuit design;

determining a grid that divides up the circuit design into a plurality of grid elements;

determining a set of hotspot grid elements from the plurality of grid elements based on the set of potential voltage drops and a voltage drop threshold; and for a select hotspot grid element in the set of hotspot grid elements:

determining a set of target connection points within the select hotspot grid element on at least one of a lower layer power rail or a lower layer ground rail of a power and ground network of the circuit design;

determining a set of source connection points for the set of target connection points, an individual source connection point of the set of source connection points being disposed on a higher layer stripe of a power and ground network of the circuit design; and using a signal router process to route a set of power grid wire connections between the set of target connection points and the set of source connection points.

* * * * *